United States Patent [19]
Nassar

[11] Patent Number: 6,164,160
[45] Date of Patent: Dec. 26, 2000

[54] INTEGRATED SOLENOID CIRCUIT ASSEMBLY

[75] Inventor: Roy S. Nassar, Rochester, Mich.

[73] Assignee: DaimlerChrysler Corporation, Auburn Hills, Mich.

[21] Appl. No.: 09/295,653

[22] Filed: Apr. 21, 1999

[51] Int. Cl.[7] ............................. F16H 57/02; H01R 33/00
[52] U.S. Cl. ........................... 74/606 R; 29/840; 439/34; 439/74; 439/540.1
[58] Field of Search ........................... 29/840; 74/606 R; 439/34, 74, 540.1

[56] References Cited

U.S. PATENT DOCUMENTS

| | | | |
|---|---|---|---|
| 3,780,431 | 12/1973 | Feeney ........................................ | 29/830 |
| 4,226,492 | 10/1980 | Deo et al. ................................... | 439/70 |
| 5,325,083 | 6/1994 | Nassar et al. . | |
| 5,338,907 | 8/1994 | Baker et al. . | |
| 5,361,650 | 11/1994 | Klecker et al. ........................ | 74/606 R |
| 5,398,018 | 3/1995 | Polityka . | |
| 5,420,565 | 5/1995 | Holbrook . | |
| 5,473,937 | 12/1995 | McCluskey et al. ................... | 73/118.1 |
| 5,692,909 | 12/1997 | Gadzinski .................................. | 439/34 |
| 5,709,134 | 1/1998 | Ulm .......................................... | 29/830 |
| 5,823,071 | 10/1998 | Petrosky et al. . | |
| 6,056,908 | 5/2000 | Petrosky et al. .................... | 264/272.14 |

OTHER PUBLICATIONS

U.S. application No. 09/283,927, Holbrook, filed Apr. 1, 1999.
U.S. application No. 09/282,671, Nassar, filed Mar. 31, 1999.
U.S. application No. 09/283,073, Nogle, filed Mar. 31, 1999.
U.S. application No. 09/283,912, Redinger, filed Apr. 1, 1999.
U.S. application No. 09/282,375, Dourra, filed Mar. 31, 1999.
U.S. application No. 09/281,861, Martin, filed Mar. 31, 1999.
U.S. application No. 09/282,234, Martin, filed Mar. 31, 1999.
U.S. application No. 09/282,376, Nogle, filed Mar. 31, 1999.
U.S. application No. 09/282,675, Martin, filed Mar. 31, 1999.
U.S. application No. 09/282,791, Redinger, filed Mar. 31, 1999.
U.S. application No. 09/282,990, Botosan, filed Mar. 31, 1999.
U.S. application No. 09/282,669, Botosan, filed Apr. 1, 1999.
U.S. application No. 09/283,899, Holbrook, filed Apr. 1, 1999.
U.S. application No. 09/283,910, Holbrook, filed Apr. 1, 1999.
U.S. application No. 09/283,454, Holbrook, filed Apr. 1, 1999.
U.S. application No. 09/283,567, Danielson, filed Mar. 31, 1999.
U.S. application No. 09/283,885, Toussagnon, filed Apr. 1, 1999.
U.S. application No. 09/295,713, Nassar, filed Apr. 21, 1999.
U.S. application No. 09/282,383, Collins, filed Mar. 31, 1999.

(List continued on next page.)

*Primary Examiner*—Allan D. Herrmann
*Attorney, Agent, or Firm*—Marc Lorelli

[57] ABSTRACT

An improved method is provided for mounting a header to an insulator body of an automatic transmission solenoid assembly. The insulator body is provided with an overmolded lead frame. The insulator body and lead frame each include a plurality of terminal pin receiving holes for receiving respective terminal pins of a header therein. The terminal pins are fountain soldered to the lead frame in order to provide a connection between the terminal pins and the lead frame. The header is also provided with a pair of header posts which extend through corresponding holes in the insulator body. Weld nuts are ultrasonically welded to the header posts in order to secure the header to the insulator body.

4 Claims, 5 Drawing Sheets

OTHER PUBLICATIONS

U.S. application No. 09/282,991, Martin, filed Mar. 31, 1999.

U.S. application No. 09/282,676, Martin, filed Mar. 31, 1999.

U.S. application No. 09/282,988, Martin, filed Mar. 31, 1999.

U.S. application No. 09/282,368, Collins, filed Mar. 31, 1999.

U.S. application No. 09/282,987, Nogle, filed Mar. 31, 1999.

U.S. application No. 09/282,918, Collins, filed Mar. 31, 1999.

U.S. application No. 09/283,911, Holbrook, filed Apr. 1, 1999.

U.S. application No. 09/282,670, Redinger, filed Mar. 31, 1999.

U.S. application No. 09/296,022, Nassar, filed Apr. 21, 1999.

U.S. application No. 09/251,258, Botosan, filed Feb. 16, 1999.

U.S. application No. 09/210,977, Correa, filed Dec. 14, 1998.

U.S. application No. 09/168,836, Dourra, filed Oct. 8, 1998.

U.S. application No. 09/277,444, Dourra, filed Mar. 26, 1999.

U.S. application No. 09/273,670, Black, filed Mar. 23, 1999.

INTEGRATED SOLENOID CIRCUIT ASSEMBLY

CROSS REFERENCE TO RELATED APPLICATIONS

The present application is related to the following co-pending applications, which are incorporated herein by reference:

U.S. Ser. No. 09/282,671 for an invention entitled "Solenoid Assembly,"

U.S. Ser. No. 09/282,375 now U.S. Pat. No. 6,072,390 for an invention entitled "PRNDL Code Using 5 Pins,"

U.S. Ser. No. 09/296,022 for an invention entitled "Adjustable Solenoid Assembly for an Automatic Transmission."

FIELD OF THE INVENTION

The present invention relates generally to a solenoid assembly for an automatic transmission of a motor vehicle, and more particularly to an insulator assembly for use with a solenoid of an automatic transmission.

BACKGROUND AND SUMMARY OF THE INVENTION

Conventional automatic transmissions include frictional units which couple a rotational input member to one or more planetary gear sets. Other frictional units, typically referred to as brakes, hold members of the planetary gear set stationary during the flow of power. Drive clutch assemblies can couple the rotating input member of the transmission to the desired elements of the planetary gear sets, while the brakes hold elements of these gear sets stationary. The planetary gear sets provide for various ratios of torque and function to ensure that the available torque and the respective tractive power demand are matched to each other.

Modern electronic transmission control systems typically include a plurality of solenoid actuated valves for controlling hydraulic fluid pressures in response to particular transmission conditions. Each of the solenoids includes a terminal that, when energized, actuates a valve which provides hydraulic fluid pressure for applying or releasing a friction element in response to a transmission controller. A transmission controller typically receives several inputs including signals representing the engine speed, transmission gear ratio, transmission range switch signals, and accelerator position. The transmission range switch signal indicates the position of the transmission shift selector. Based upon the inputs received, the transmission controller provides signals to the solenoid actuated valves which are provided in a solenoid manifold. The solenoid valves which are within the manifold are electronically actuated and are communicated with the controller.

The present invention consists of an insulator assembly which is used in a solenoid assembly of an automatic transmission for providing electrical signals between the controller and the solenoid actuated valves. The insulator assembly also provides communication with a transmission range switch which is integrally formed within the insulator assembly. The insulator assembly includes an insulator body which is overmolded on a lead frame. The insulator body and the lead frame include a plurality of terminal pin receiving holes therein. The insulator body further includes a pair of header post receiving holes. A header is provided including a plurality of terminals which provide an electrical connection between the solenoid valves and the transmission controller. The header includes at least one header post. The header is mounted to the insulator such that the plurality of terminal pins each extend through a corresponding one of the terminal pin receiving holes in the insulator body and the lead frame. Each of the plurality of terminal pins is fountain soldered to the lead frame to form an electrical connection therebetween. The at least one header post extends through the at least one header post receiving hole in the insulator and is secured therein by a weld nut which is ultrasonically welded to the header post.

Further areas of applicability of the present invention will become apparent from the detailed description provided hereinafter. It should be understood however that the detailed description and specific examples, while indicating preferred embodiments of the invention, are intended for purposes of illustration only, since various changes and modifications within the spirit and scope of the invention will become apparent to those skilled in the art from this detailed description.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
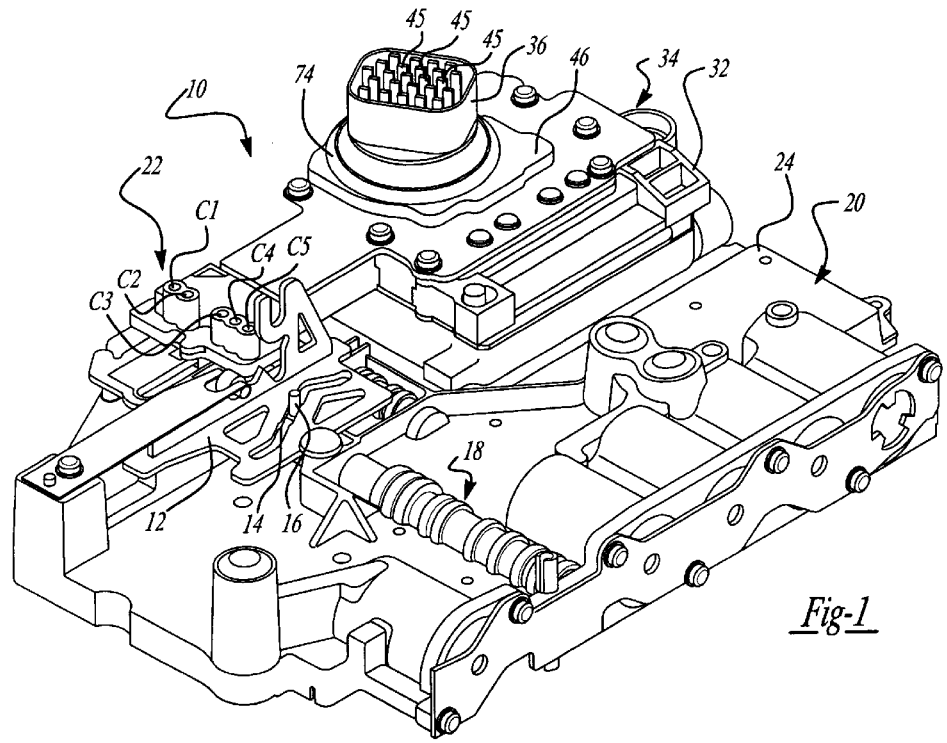
FIG. 1 is a perspective view of a valve assembly for an automatic transmission according to the principles of the present invention.
Figure 2:
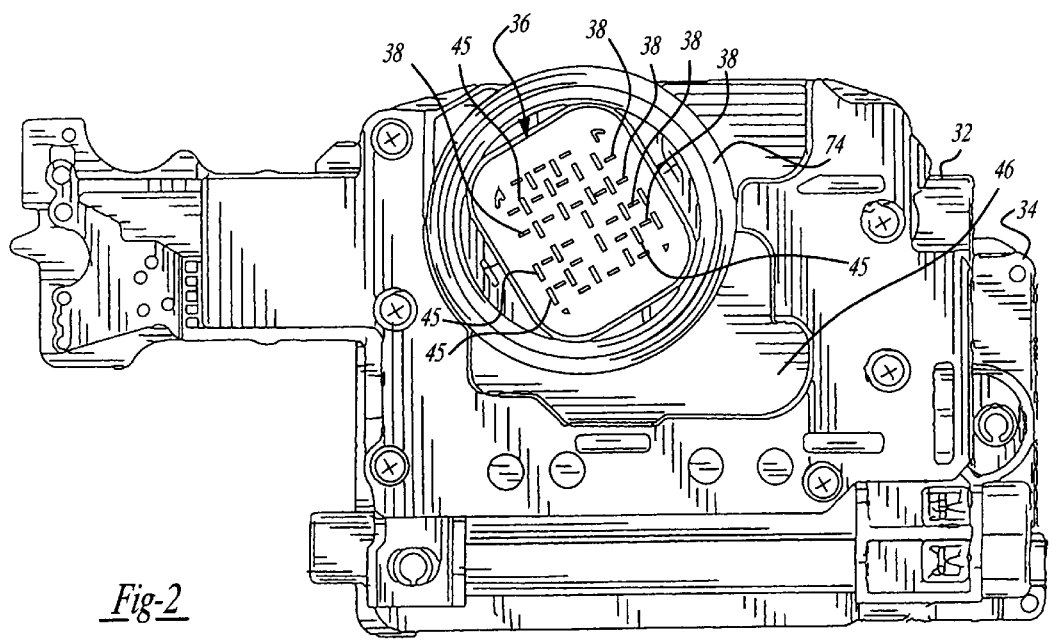
FIG. 2 is a top view of a solenoid assembly constructed in accordance with the teachings of a preferred embodiment of the present invention.
Figure 3:
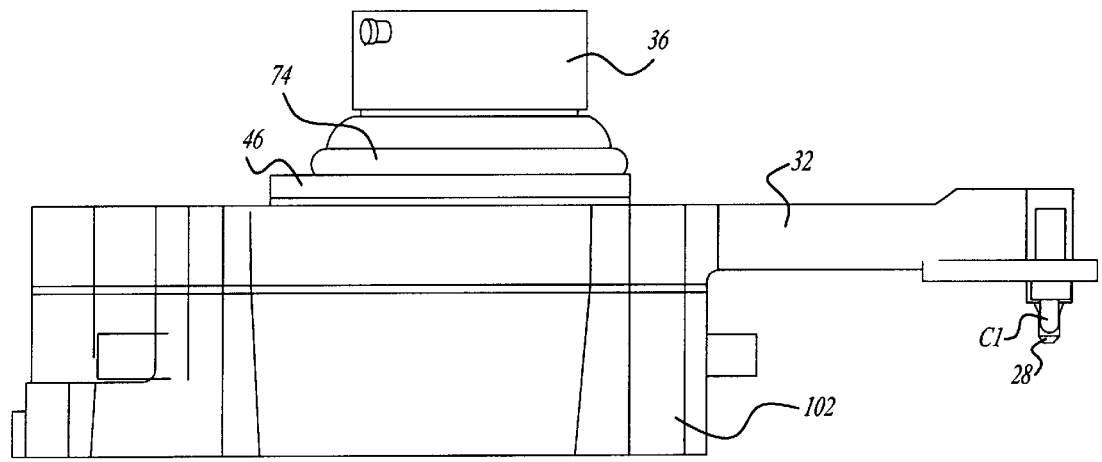
FIG. 3 is a side view of the solenoid assembly shown in FIG. 2.

With reference to FIG. 1, a position-sensing assembly 10 is shown therein for sensing the position of a manual gear select lever (not shown) of an automatic transmission. The position-sensing assembly 10 includes coding plate 12 which is operably movable by movement of a manual valve lever (not shown). Coding plate 12 has a cam surface composed of a slot or cam groove 14 formed therein that engages a valve pin 16. Valve pin 16 is connected to a manually operated valve 18 for controlling the hydraulic fluid flow throughout a valve assembly 20 in an automatic transmission. As such, the movement of the transmission shift lever causes linear translation of coding plate 12 to predetermined positions, which in turn controls the hydraulic system of the transmission.

A transmission range switch unit 22 is mounted above a portion of coding plate 12 for sensing the position of coding plate 12. Transmission range switch 22 is fastened to a valve body 24 in a known manner. A channel is provided between the transmission range switch 22 and valve body 24 which allows coding plate 12 to slide linearly relative to the transmission range switch 22.

Figure 5:
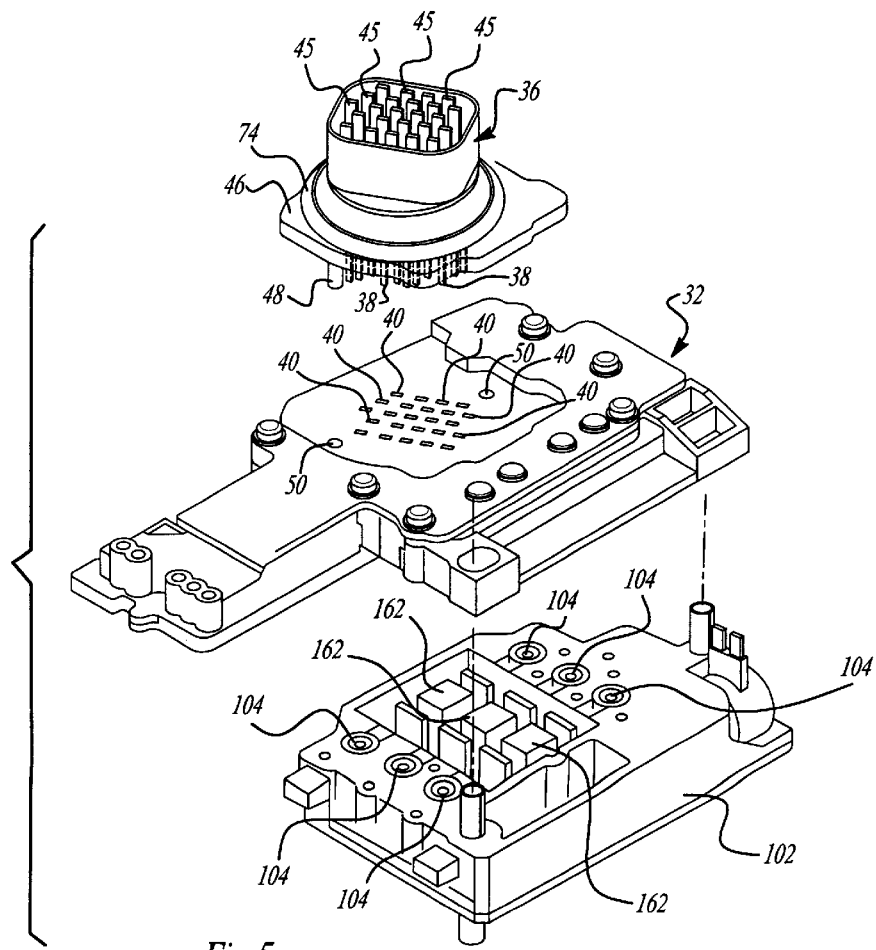
FIG. 5 is an exploded perspective view illustrating the assembly of the solenoid assembly with the electrical coils removed for clarity.
Figure 7:
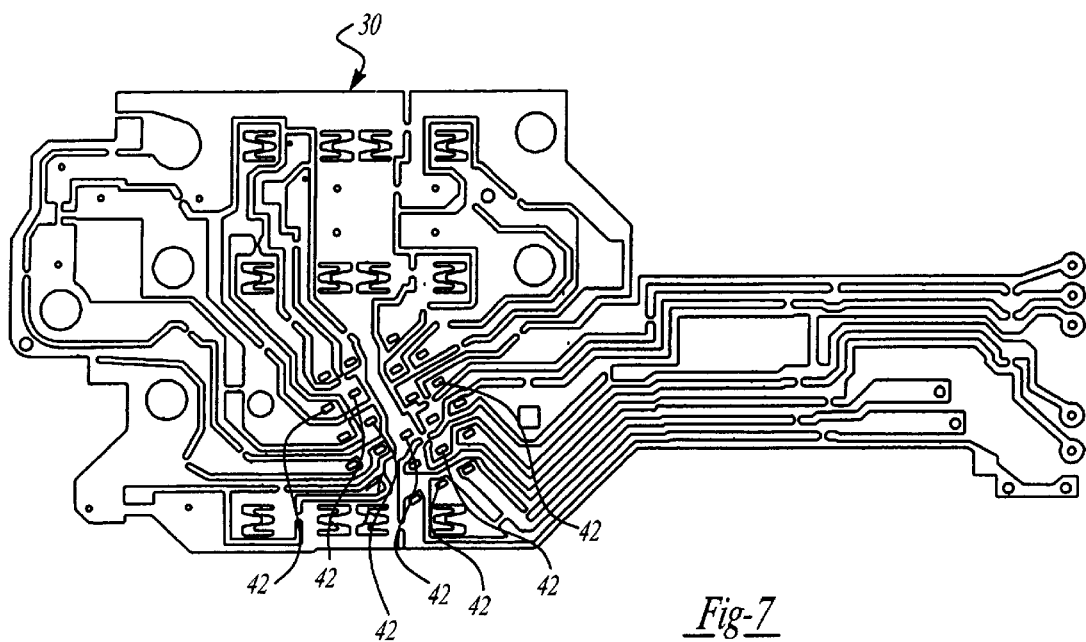
FIG. 7 is a plan view of the lead frame according to the principles of the present invention.

Transmission range switch 22 includes five spring-loaded electrical contact pins C1–C5 that extend therefrom and contact conductive and non-conductive areas on a contact surface on coding plate 12. In this regard, it should be understood that the electrical contact pins C1–C5 extend in a generally perpendicular relationship to the plane of coding plate 12. Transmission range switch 22 still further includes a support member 28 in the form of an integrally formed support pin that supports and stabilizes range switch 22 and provides substantial uniform contact between each of the electrical contacts C1–C5 and coding plate 12. Transmission range switch 22 further includes an electrical connection member in the form of a lead frame 30 (best shown in FIG. 7). The lead frame 30 is overmolded within an insulator body 32 (best shown in FIG. 5). The insulator body 32 provides a housing for the lead frame 30 as well as serving as a cover for the solenoid assembly 34.

A header 36 is mounted to the insulator body 32 and is provided with a plurality of terminals 38. The terminals 38 extend through a body portion 44 of the header 36. A plurality of plastic guide members 45 extend from an upper surface of the body portion 44 generally parallel to the terminals 38. Guide members 45 facilitate proper alignment of the header 36 with the transmission controller. The terminals 38 further extend through corresponding terminal pin receiving holes 40 provided in the insulator body 32 and through terminal pin receiving holes 42 provided in the lead frame 30. The header 36 includes a base portion 46 which extends radially outward from the main body portion 44 of the header 36.

A pair of header posts 48 extend downward from the base portion 46 and are received in post receiving holes 50 provided in the insulator body 32 during assembly of the header 36 to the insulator 32. The terminals 38, and header posts 48 are lined with the corresponding terminal receiving holes 40 and the post receiving holes 50 of the insulator body 32. The terminals 38 are inserted in the terminal receiving holes 40 and the header posts 48 are received within the post receiving holes 50. The header 36 is then clamped to the insulator body 32. A pair of weld nuts 54 are then slid over the ends of the header posts 48 and are sonically welded thereto for securing the header 36 to the insulator 32.

Figure 8:
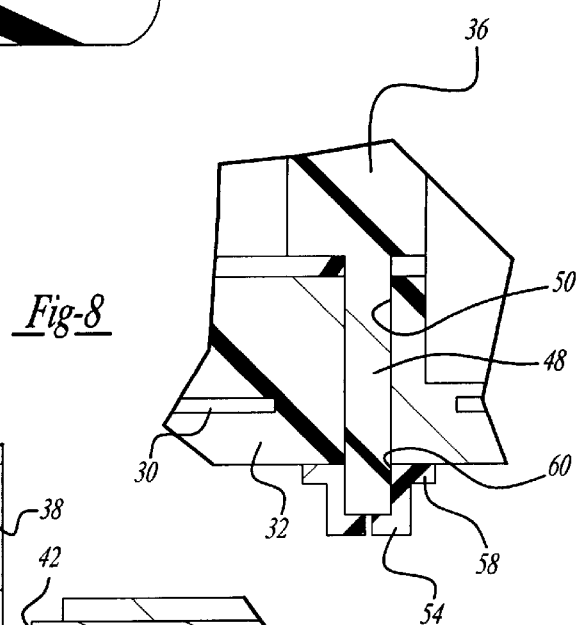
FIG. 8 is a cross-sectional view illustrating the weld nuts secured to the header post securing the header to the insulator.

A detailed cross-sectional view illustrating the mounting between the header post 48 and a weld nut 54 is shown in FIG. 8. The welded joint provided by the weld nuts 54 are stronger than a threaded retainer system. The weld nuts 54 are provided with a hat-shaped configuration including a radially extending flange 58 at the open end 60 of the weld nut 54 in order to facilitate proper alignment by an automated weld nut application system.

Figure 9:
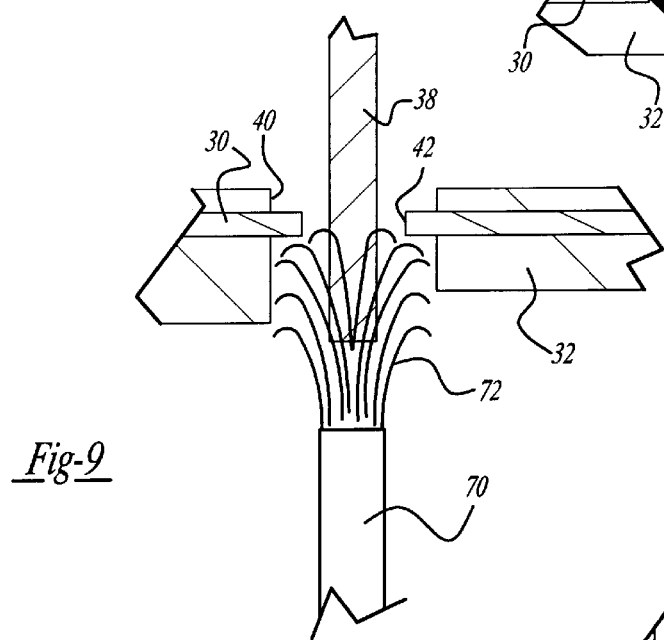
FIG. 9 illustrates the fountain soldering technique for soldering the terminals of the header to the lead frame within the insulator.
Figure 10:
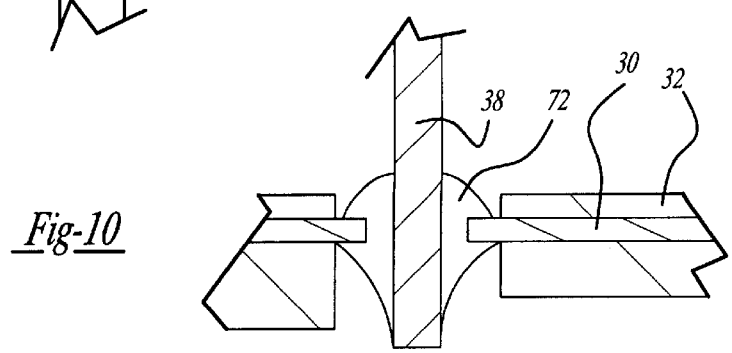
FIG. 10 is a cross-sectional view of a finished soldered connection between a terminal and the lead frame disposed within the insulator.

The terminals 38 are then fountain soldered to the lead frame 30 as shown in FIGS. 9 and 10. With reference to FIG. 9, a fountain soldering device 70 is utilized from the underside of the insulator 32 to apply solder 72 to the terminal 38 which extends through the hole 42 in the lead frame 30 and hole 40 in the insulator body 32. As the solder 72 contacts the terminal 38, the solder travels along the terminal 38 to fill the hole 40 provided by the insulator body 32 and thereby providing electrical contact between the terminal 38 and the lead frame 30. FIG. 10 illustrates a finished soldered connection between the terminal 38 and lead frame 30. The solder 72 completes the electrical connection between the lead frame 30 and terminal 38. The insulator body 32 provides a protective insulative layer between different circuit elements of the lead frame 30. The fountain soldering device is so called because it resembles a fountain as the solder spills out of the fountain soldering device 70.

Figure 6:
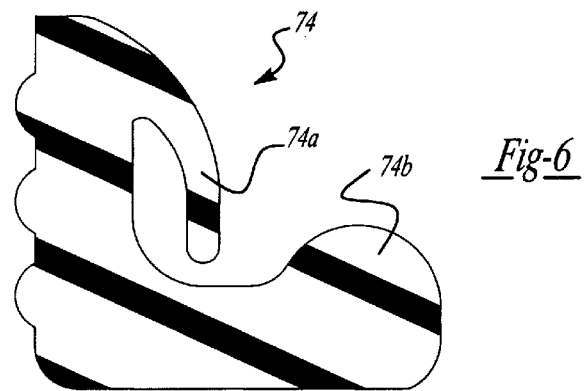
FIG. 6 is a cross-sectional view of the seal disposed around the header in an unloaded condition.

A seal 74 is provided around a circumference of the header 36 and is provided with a dust shield portion 74a and a rounded lip seal portion 74b (best shown in FIG. 6). During assembly, the header 36 is engaged with a corresponding electrical connection member (not shown) of the transmission control unit on the transmission housing 76 which abuts against the seal 74 thus providing a sealed contact between the transmission housing 76 and the solenoid assembly.

Figure 4:
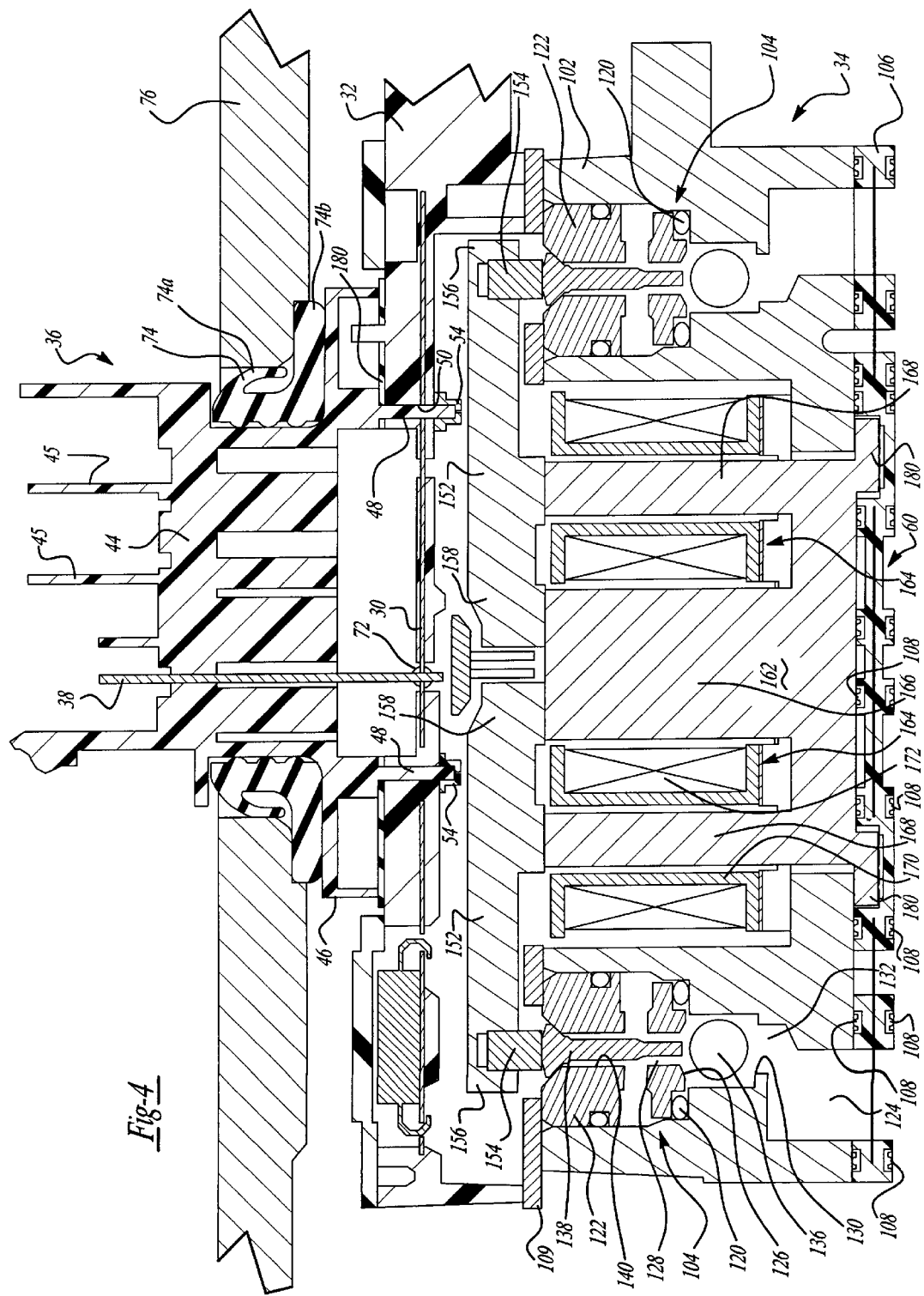
FIG. 4 is a cross-sectional view of the solenoid assembly taken through the header and one pair of solenoid valves.

With reference to FIG. 4, the solenoid assembly 34 is shown to generally include a manifold housing 102 and a plurality of valves 104 for controlling the transfer of hydraulic fluid pressure in response to particular transmission conditions by directing the hydraulic fluid through the housing 102. The housing 102 with the valves 104 communicates through a plastic screen carrier 106 to the transmission valve body assembly 24. The screen carrier 106 functions to filter particulates out of hydraulic fluid passing through the screen carrier 106 to and from the transmission valve body assembly 24. The screen carrier 106 has torque retainers to prevent clamping-load loss due to plastic creep. Thus screen carrier 106 has a bead of flexible seal 108 to prevent leakage.

The solenoid assembly 34 is mounted to the valve body 24 in a manner well known in the art. A retainer plate 109 holds the valves 104 in place and the insulator assembly 32 is mounted to a top of the housing 102. The retainer plate 109 also establishes a reference plane for the valves 104 to assure proper location in the upward vertical direction, as shown in FIG. 4.

The exemplary embodiment of the present invention includes two normally applied valves and four normally vented valves 104. The cross-sectional view of FIG. 4 illustrates two of the valves 104. In a conventional manner, the normally applied and normally vented valves 104 are operatively controlled by the transmission controller to provide hydraulic pressure to selected lines of the automatic transmission for activating and deactivating various clutch and brake elements of the transmission.

Briefly, the valves 104 shown in FIG. 4 include a valve body 122 mounted in the housing 102 and disposed within a fluid path 124. The valve body 122 defines an upper valve seat 126 and a central passage 128 communicating therethrough. The valves 104 further include a lower seat element 130 defining a lower seat having a central passage 132 communicating therethrough. A steal ball 136 is disposed within the fluid path and movable between a first position in which fluid may pass through the central passage 128 of the upper valve seat 126 and a second position in which fluid is prevented from passing through central passage 128 of the upper valve seat 126. A plunger 138 having a longitudinal axis aligned with the center of the ball 134 is disposed within a vertically extending channel 140 passing through the valve body 122. The plunger 138 is operated in a manner to be discussed below to move the ball 134 between the first and second positions.

An armature 152 is associated with the ball 136 and plunger 138 of each of the valves 104. The armature 152 is movable in a known manner for actuating the associated plunger 138 in response to the presence and absence of a magnetic field. An armature pin 154 is press-fit into a first end 156 of the armature 152 and is adapted to selectively engage an upper end of the associated plunger 138. The press-fit condition is adjustable, depending on stack conditions. The armature 152 pivots about a second end 158 in response to the presence and absence of the magnetic field.

To provide means for selectively establishing the magnetic field for controlling the armatures 152, the solenoid assembly 34 of the present invention includes an electro magnetic arrangement 60. In the exemplary embodiment, the electromagnetic arrangement 60 is shown to generally include a plurality of cores 162 within the housing 102 and an electrical coil 164 associated with each of the valves 104. In a preferred embodiment, each core 162 includes an upwardly extending center post 166 and a pair of upwardly extending outer posts 168. The posts 166 and 168 are generally rectangular in horizontal cross section. Each of the electrical coils 164 of the electromagnetic arrangement includes a plastic coil body 170 and a plurality of copper windings 172. Each coil body 170 defines a generally rectangular aperture 174 for receiving the outer posts 168. Each electrical coil 164 includes a pair of terminals (not shown) which plug into an underside of the insulator 32 in a conventional manner. In a known manner, the terminals provide electricity to the plurality of copper windings 172.

In the exemplary embodiment, each of the cores 162 includes a plurality of stamped metal plates. The stacked plates each have a generally M-shape which is inverted. Three legs of the stacked plates extend upwardly and cooperate to define the center and outer posts 166 and 168. The plates include a pair of horizontally extending segments 180 which oppose an underside of the housing 102. The screen carrier 106 holds the cores 162 against the housing 102 thereby eliminating the need for separate core retaining fasteners.

The O-rings 120 maintain an axial load on the valves 14A and 14B against the retainer plate 109. This arrangement allows easy measurement of adjustment by measuring dimensions from the core 162 to the valves 104.

The present invention provides an improved mounting arrangement for mounting the header 36 to the insulator body 32. According to a preferred embodiment, the header 36 includes a radially extending base 46 which rests against a gasket 180 disposed between the header 36 and insulator body 32. A pair of header posts 48 extend through header post receiving holes 50 provided in the insulator body 32 and a pair of weld nuts 54 are secured to the header posts 48 for securing the header 36 to the insulator 32. The terminals 38 which were supported by the header 36 extend through corresponding terminal pin receiving holes 42 and 40 provided in the lead frame 30 and insulator body 32, respectively. A fountain soldering technique is utilized for soldering the terminals 38 to the lead frame 30 from the underside of the insulator 32. The fountain soldering technique allows the terminals 38 to be soldered to the lead frame 30 with a reduced likelihood for bridging between the terminals. Furthermore, the fountain soldering technique can be readily utilized with an automated soldering system since bridging is less of a concern.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An insulator assembly for use with a solenoid of an automatic transmission, comprising:

an insulator body including an overmolded lead frame, said insulator body and said lead frame including a plurality of terminal pin receiving holes therein, said insulator body including at least one header post receiving hole; and a header including a plurality of terminal pins and at least one header post, said header being mounted to said insulator body such that said plurality of terminal pins each extend through a corresponding one of said terminal pin receiving holes in said insulator body and said lead frame, each of said plurality of terminal pins being soldered to said lead frame, said at least one header post further extending through said at least one header post receiving hole in said insulator body and being secured therein by a weld nut disposed on an end thereof.

2. A method for assembling a header to a lead frame, comprising the steps of:

providing a header including a plurality of terminal pins;

providing an insulator body including an overmolded lead frame, said insulator body and said lead frame including a plurality of terminal pin receiving holes therein;

inserting said plurality of terminal pins of said header through a corresponding one of said terminal pin receiving holes in said insulator body and said lead frame; and fountain soldering each of said plurality of terminal pins to said lead frame.

3. A method for assembling a header to a lead frame, comprising the steps of:

providing a header including a plurality of terminal pins and at least one header post;

providing an insulator body including a plastic overmolded lead frame, said insulator body and said lead frame each including a plurality of terminal pin receiving holes therein, said insulator body including at least one header post receiving hole;

inserting said plurality of terminal pins of said header through a corresponding one of said terminal pin receiving holes in said insulator body and said lead frame while simultaneously inserting said header post through said header post receiving hole;

fountain soldering each of said plurality of terminal pins to said lead frame; and ultrasonically welding a weld nut on an end of said at least one header post.

4. A method for assembling a header to a lead frame, comprising the steps of:

providing a header including a plurality of terminal pins and at least one header post;

providing an insulator body including a plastic overmolded lead frame, said insulator body and said lead frame including a plurality of terminal pin receiving holes therein, said insulator body including at least one header post receiving hole;

inserting said plurality of terminal pins of said header through a corresponding one of said terminal pin receiving holes in said insulator body and said lead frame while simultaneously inserting said header post through said header post receiving hole; and ultrasonically welding a weld nut on an end of said at least one header post.

* * * * *